United States Patent [19]

Leenders et al.

[11] Patent Number: 5,385,805
[45] Date of Patent: Jan. 31, 1995

[54] PROCESS AND MATERIALS FOR CONTROLLING THE VISUAL ASPECT OF IMAGES

[75] Inventors: Luc Leenders; Eddie Daems, both of Herentals, Belgium

[73] Assignee: AGFA-Gevaert, N.V., Mortsel, Belgium

[21] Appl. No.: 155,221

[22] Filed: Nov. 22, 1993

[30] Foreign Application Priority Data

Dec. 1, 1992 [EP] European Pat. Off. ............ 92203713

[51] Int. Cl.⁶ .............................................. G03C 11/12
[52] U.S. Cl. .................... 430/257; 430/256; 430/258; 430/262; 428/42
[58] Field of Search ............... 430/256, 257, 258, 262; 428/42

[56] References Cited

U.S. PATENT DOCUMENTS 4,925,767  5/1990  Daems et al. ................... 430/258
5,270,147  12/1993 Van Thillo et al. ............. 430/259

*Primary Examiner*—Hoa Van Le
*Attorney, Agent, or Firm*—Breiner & Breiner

[57] ABSTRACT

Process and material for controlling the visual aspect of an image present in a hydrophilic colloid layer, layer system, or relief pattern on a permanent support by transferring a continuous non-photosensitive layer assembly from a temporary support to said image, said transfer being brought about by pre-wetting the image-carrying permanent support, bringing the pre-wet image-carrying permanent support in face-to-face contact with said continuous non-photosensitive layer assembly carried by said temporary support, stripping off the temporary support to leave said continuous non-photosensitive layer assembly covering and adhering to said image-carrying permanent support, and drying the resulting layer packet, wherein said continuous non-photosensitive layer assembly comprises in the given sequence a polyester layer having sufficient adhesiveness to said temporary support to remain adhering thereto before being stripped therefrom and yet having sufficient repellency in respect of said temporary support to make possible an easy separation therefrom, a subbing layer system, and an adhesive top layer showing high adhesiveness to said pre-wet, image-carrying permanent support.

14 Claims, No Drawings

PROCESS AND MATERIALS FOR CONTROLLING THE VISUAL ASPECT OF IMAGES

DESCRIPTION

The present invention relates to a process and materials for controlling the visual aspect of images present in hydrophilic colloid layer(s) or relief pattern(s).

The visual aspect of images obtained in hydrophilic colloid media such as in a developed and fixed gelatin silver halide emulsion layer is largely affected by background color and light-reflectance of the support that carries the image layer. Photographs to be inspected in reflection usually have a polyethylene-coated paper support. The surface structure of the polyethylene-coated paper and its color tone largely determine the visual aspect of the image e.g. its gloss. A glossy aspect adds to the contrast and gives a better rendering of fine detail. Glossy photographic paper as supplied by the manufacturer dries with a shiny surface, which can further be improved by glazing. For example, a wet print can be glazed by squeegeeing it onto a clean polished surface that optionally is heated. Hot-glazing requires the use of gelatin layers that are hardened otherwise they would melt and stick to the glazing plate.

Normally photographic silver halide emulsion materials have an outermost anti-abrasion layer.-Known anti-abrasion layers usually are gelatin layers having a thickness of a few μm and optionally containing a hardening agent for gelatin e.g. chrome alum or some colloidal inorganic material such as silica as described e.g. by P. Glafkidës in "Photographic Chemistry", Vol. I, Fountain Press—London (1985) p. 474 and in FR-P 1,551,591.

The application of a thin anti-abrasion layer acting also as gloss-improving layer, by coating from a liquid composition requires a cumbersome and sophisticated coating equipment, which in practice is available only in factories producing photographic materials. In some cases it may be interesting to have the possibility to determine at the stage of image processing what kind of visual aspect a print should have. For example, such is the case when a photographic image has been formed on a permanent support by a plurality of superposed hydrophilic colloid patterns representing a multi-color relief image obtained by wash-off processing of hardening-developed colored hydrophilic colloid layers.

The production of color relief images representing linework or halftone multicolor colloid patterns is of interest in the field of design, e.g. in the production of color decorative patterns, color wiring and circuit diagrams, cartography, color proofing and the production of images on reflective base for overhead projection.

Photographically produced color proofs are a substitute for multicolor halftone reproductions as will be produced by successive printing in register with the separate standard inks: magenta, yellow, cyan and black, on a conventional printing press.

Press proofing for the production of color proofs by preparing a printing plate and running the plate on the press to produce only a few copies as proof of the quality of the halftone separation transparencies used in the plate production is a very expensive procedure and therefore photographic processes have been developed to obtain a similar result by means of which the aspect of a print obtained from particular color separation negatives or positives can be judged by the printer and client before the expensive press printing process is started.

Examples of processes for the production of multicolor relief patterns using the transfer of colored colloid layers from a temporary support onto a permanent support have been described in e.g. U.S. Pat. Nos. 3,642,474, 4,701,401 and 4,710,444.

In such processes the multicolor pattern is formed by superposed relief patterns obtained by wash-off processing.

When said processes are used for the production of multicolor halftone images serving as pre-press color proof, it is important that the total dot area of the screened images obtained resembles as close as possible the total dot area of the halftone prints obtained in the mechanical printing process. The optical dot area (ODA) is a measure of the total dot area that takes into account both physical and optical dot gain. The optical dot area (ODA) is the total amount of light absorbed by the halftone dot pattern printed on a substrate. It is expressed as the percentage of the substrate that would have to be covered with halftone dots to achieve a certain density, provided there was no dot spread and the substrate reflected 100 percent of the light on the surface (ref. the article "Dot Gain: Causes and Cures'-'—"The Quality Control Scanner" published monthly by Graphic Arts Publishing Co., 3100 Bronson Hill Road, Livonia NY 14487. (1982) Volume 2, Number 9, p. 5).

Dot gain is made up of two components, physical and optical dot gain. Physical dot gain is an enlargement of mechanical dot size which occurs during the printing process wherein individual ink dots are spread on the printing paper.

Optical dot gain results when light penetrates the printing paper in the clear areas, becomes internally scattered therein and partially absorbed in the ink dots making the dots visually appear larger. Optical dot gain can be influenced by changing the paper stock (see the article "Gaining on Dot Gain" by Johan Strashun in Graphic Arts Montly, January 1985, p. 69).

In offset printing the greatest dot gain occurs in the mid tones, i.e. around the 50 percent dot value. Good color balance is obtained when all colors have equal dot gain.

It is known from EP-A 0,236,783 to make electrophotographic color proofs of halftone dot patterns, which color proofs closely simulate the dot gain of prints made with lithographic plates and inks. The resulting color proof comprises a toner dot pattern on a reflective support and the toner pattern is covered by stripping and laminating with a thin transparent layer and a thicker transparent layer to give the screen dots in the toner pattern an apparent increase in optical dot area (ODA) which simulates that of the press print.

For completeness' sake reference is also made to EP-A 0,183,467, in which a resin-coated photographic base paper has been described, which comprises a paper support carrying on its face side an extruded first layer of low density polyethylene or a blend of low density and high density polyethylene containing at least 50% by weight of low density polyethylene, the first layer being coated at a ratio of 10 to 50 g/m2 and containing at least 5% of opacifying pigment, and an extruded second layer of a polymer having a stiffness modulus of at least 0.5 GPa, e.g. a polycarbonate resin. This photographic base paper is merely a stiff non-strippable support, on which photographic emulsions can be coated.

It has been found now that the visual aspect of images present in hydrophilic colloid layer(s) or relief pattern(s) can be improved according to the process and by means of the materials described hereinafter.

The process according to the present invention for controlling the visual aspect of an image present in a hydrophilic colloid layer, layer system, or relief pattern on a permanent support is characterized by the step of transferring a continuous non-photosensitive layer assembly from a temporary support to said image, said transfer being brought about by the consecutive steps of:

1) pre-wetting the image-carrying permanent support,
2) bringing the pre-wet image-carrying permanent support in face-to-face contact with said continuous non-photosensitive layer assembly carried by said temporary support,
3) stripping off the temporary support to leave said continuous non-photosensitive layer assembly covering and adhering to said image-carrying permanent support, and
4) drying the resulting layer packet, wherein said continuous non-photosensitive layer assembly comprises in the given sequence:
   a) a polyester layer having sufficient adhesiveness to said temporary support to remain adhering thereto before being stripped therefrom and yet having sufficient repellency in respect of said temporary support to make possible an easy separation therefrom,
   b) a subbing layer system, and
   c) an adhesive top layer showing high adhesiveness to said pre-wet image-carrying permanent support.

The present invention thus also provides a material comprising a continuous non-photosensitive layer assembly carried by a temporary support, said material comprising the following layers in the given sequence on said temporary support:

a polyester layer applied, e.g. laminated, to said temporary support and having a thickness of 5 to 30 μm, a subbing layer system comprising an optional primer coating e.g. of a copolyester and a subbing layer, and an adhesive top layer comprising gelatin and an adhesion-improving substance e.g. a polymer dispersion having a glass transition temperature lower than 0° C.

This process and material give satisfactory results for controlling gloss of an image obtained in a hydrophilic colloid layer or in superposed hydrophilic colored colloid relief patterns obtained e.g. by wash-off processing of colored image-wise hardened hydrophilic colloid layers.

The process offers easy handling and a short access time. Moreover, the resulting layer packet has a low curling tendency.

The temporary support of the continuous non-photosensitive layer assembly preferably is a polyolefin-coated paper support such as a polyethylene- or polypropylene-coated paper support.

The polyester layer preferably is a polyethylene terephthalate layer.

The subbing layer system consists of an optional primer coating, preferably comprising a copolyester of terephthalic acid, isophthalic acid, and sulfo-isophthalic acid and a subbing layer, preferably a layer comprising gelatin and cellulose nitrate.

The sticking power of the adhesive top layer to the pre-wet image-carrying permanent support can be improved substantially by adding dispersed polymer particles having a glass transition temperature (Tg) lower than 0° C., preferably lower than −10° C., as adhesion-improving substance to the gelatin of the adhesive top layer. Polymer particles containing an amount of monomer groups having a hydrophilic character e.g. free carboxylic acid groups as in copoly(vinyl acetate/acrylate ester/methacrylic acid) in which the content of methacrylic units is preferably in the range of 0.5 to 5 mol % and the Tg is −18° C. are preferred. A suitable adhesion-improving substance of this type is sold under the registered trade mark DARATAK 74L by Grace Organic Chemical Division—Lexington, U.S.A. A more preferred adhesion-improving substance is, however, polyethyl acrylate.

The color tone of the image on the permanent support can be controlled by incorporating diffusion-resistant dyes or pigments in at least one layer of the continuous non-photosensitive layer assembly. For instance, a yellowish-brown tone of antique photographs or parchment base documents can be simulated thereby.

The transfer of the continuous non-photosensitive layer assembly from the temporary support is accomplished by pre-wetting the image-carrying permanent support with water, usually plain water, and pressing the continuous non-photosensitive layer assembly in dry state on the wet image-carrying permanent support. This can be done e.g. by feeding both materials through the nip of a roller pair exerting pressure on the contacting materials. After the transfer has been completed, the temporary support is peeled off e.g. by hand.

In the following example the composition and the use of a continuous non-photosensitive layer assembly is described.

EXAMPLE

Preparation of continuous non-photosensitive layer assembly

A temporary support consisting of a paper sheet having a weight of 100 g/m2.was coated by extrusion on one side with polyethylene to form a thin polyethylene layer thereon having a thickness of 30 μm. The hot polyethylene-coating was co-laminated with a polyethylene terephthalate film having a thickness of 12 μm.

A primer coating was applied to the polyethylene terephthalate layer by coating thereon a solution of copolyester of terephthalic acid, isophthalic acid, and sulfo-isophthalic acid (53/40/7% by weight) in ethanol at a ratio of 0.5 g/m2.

Next, a subbing layer was applied to the primer coating by coating thereon a composition containing the following ingredients:

| | |
|---|---|
| gelatin | 200 mg/m2 |
| cellulose nitrate | 125 mg/m2 |
| salicylic acid | 100 mg/m2 |

An adhesive top layer containing the following ingredients was then coated on the subbing layer:

| | |
|---|---|
| gelatin | 2.0 g/m2 |
| DARATAK 74L as above identified | 1.4 g/m2 |

| | |
|---|---|
| matting agent A | 0.015 g/m2 |
| wetting agent W1 | 0.075 g/m2 |
| wetting agent W2 | 0.03 g/m2 |

Matting agent A = polymethyl methacrylate particles having an average particle size of 4 μm Wetting agent W1 = saponin Wetting agent W2 = disodium salt of heptadecyl-benzimidazole disulfonic acid Use of the continuous non-photosensitive layer assembly A permanent support carrying a gelatin layer comprising a silver image (image-carrying permanent support) was wet with plain water and pressed in face-to-face contact with the dry adhesive top layer of the above continuous non-photosensitive layer assembly by conveying the contacting materials through the nip of a pair of pressure rollers.

After a contact time of 2 min in a hot airstream of 55° C. the temporary support was stripped off, thus leaving the layer packet consisting of polyethylene terephthalate layer, subbing layer, and adhesive layer adhering tightly to the image-carrying permanent support.

The gloss of the resulting laminate (Invention) was measured by means of a gloss meter commercially available from Dr. LANGE, Type LMG 074 having a measuring angle of 20° and satisfying the standards ASTM D523, DIN 67530.

The gloss of the resulting laminate was compared with that measured on a same silver image-containing gelatin layer but that had not been covered with the gloss-improving layers (Comparison).

| Gloss results | |
|---|---|
| Invention | 55.6 |
| Comparison | 30.2 |

We claim:

1. Process for controlling the visual aspect of an image present in a hydrophilic colloid layer, layer system, or relief pattern on a permanent support by transferring a continuous non-photosensitive layer assembly from a temporary support to said image, wherein said transfer is brought about by the consecutive steps of:
   1) pre-wetting the image-carrying permanent support,
   2) bringing the pre-wet image-carrying permanent support in face-to-face contact with said continuous non-photosensitive layer assembly carried by said temporary support,
   3) stripping off the temporary support to leave said continuous non-photosensitive layer assembly covering and adhering to said image-carrying permanent support, and.
   4) drying the resulting layer packet, wherein said continuous non-photosensitive layer assembly comprises in the given sequence:
      a) a polyester layer having sufficient adhesiveness to said temporary support to remain adhering thereto before being stripped therefrom and yet having sufficient repellency in respect of said temporary support to make possible an easy separation therefrom,
      b) a subbing layer system, and
      c) an adhesive top layer showing high adhesiveness to said pre-wet image-carrying permanent support.

2. The process according to claim 1, wherein said temporary support is a polyolefin-coated paper support.

3. The process according to claim 2, wherein said polyolefin-coated paper support is a polyethylene- or polypropylene-coated paper support.

4. The process according to claim 1, wherein said polyester layer is a polyethylene terephthalate layer.

5. The process according to claim 1, wherein said subbing layer system includes a primer coating which comprises a copolyester of terephthalic acid, isophthalic acid, and sulfo-isophthalic acid.

6. The process according to claim 1, wherein said subbing layer comprises gelatin and cellulose nitrate.

7. The process according to claim 1, wherein said adhesive top layer includes an adhesion-improving substance which is polyethyl acrylate.

8. Material comprising a continuous non-photosensitive layer assembly carried by a temporary support, wherein said material comprises the following layers in the given sequence on said temporary support:
   a polyester layer applied to said temporary support and having a thickness of 5 to 30 μm,
   a subbing layer system comprising an optional primer coating and a subbing layer, and
   an adhesive top layer comprising gelatin and an adhesion-improving substance.

9. A material according to claim 8, wherein said temporary support is a polyolefin-coated paper support.

10. A material according to claim 9, wherein said polyolefin-coated paper Support is a polyethylene- or polypropylene-coated paper support.

11. A material according to claim 8, wherein said polyester layer is a polyethylene terephthalate layer.

12. A material according to claim 8, wherein said primer coating comprises a copolyester of terephthalic acid, isophthalic acid, and sulfo-isophthalic acid.

13. A material according to claim 8, wherein said subbing layer comprises gelatin and cellulose nitrate.

14. A material according to claim 8, wherein said adhesion-improving substance is polyethyl acrylate.

* * * * *